United States Patent
Ng et al.

(10) Patent No.: US 6,624,040 B1
(45) Date of Patent: Sep. 23, 2003

(54) SELF-INTEGRATED VERTICAL MIM CAPACITOR IN THE DUAL DAMASCENE PROCESS

(75) Inventors: Chit Hwei Ng, Singapore (SG); Chaw Sing Ho, Singapore (SG); John E. Martin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/251,350

(22) Filed: Sep. 20, 2002

(51) Int. Cl.[7] ............... H01L 21/76; H01L 21/00; H01L 21/8242; H01L 21/4763; H01L 21/44
(52) U.S. Cl. ............ 438/422; 438/637; 438/3; 438/240; 438/239; 438/250; 438/687
(58) Field of Search ............... 438/422, 456, 438/637, 638, 639, 3, 240, 156, 173, 192, 206, 212, 239, 243, 250, 253, 259, 268, 386, 687

(56) References Cited

U.S. PATENT DOCUMENTS

| | | | |
|---|---|---|---|
| 5,837,578 A | * 11/1998 | Fan et al. | 438/254 |
| 6,025,226 A | 2/2000 | Gambino et al. | 438/244 |
| 6,069,051 A | 5/2000 | Nguyen et al. | 438/396 |
| 6,087,261 A | 7/2000 | Nishikawa et al. | 438/685 |
| 6,117,747 A | 9/2000 | Shao et al. | 438/396 |
| 6,143,601 A | 11/2000 | Sun | 438/253 |
| 6,157,793 A | 12/2000 | Weaver et al. | 399/45 |
| 6,159,787 A | 12/2000 | Aitken et al. | 438/243 |
| 6,242,315 B1 | * 6/2001 | Lin et al. | 438/393 |
| 6,259,128 B1 | 7/2001 | Adler et al. | 257/301 |
| 6,271,084 B1 | 8/2001 | Tu et al. | 438/253 |
| 6,271,555 B1 | * 8/2001 | Hakey et al. | 257/296 |
| 6,320,244 B1 | 11/2001 | Alers et al. | 257/534 |
| 6,346,454 B1 | * 2/2002 | Sung et al. | 438/396 |
| 6,399,495 B1 | * 6/2002 | Tseng et al. | 438/687 |
| 6,426,249 B1 | * 7/2002 | Geffken et al. | 438/239 |
| 6,472,721 B2 | * 10/2002 | Ma et al. | 257/531 |
| 6,498,092 B2 | * 12/2002 | Lee et al. | 438/634 |
| 6,551,919 B2 | * 4/2003 | Venkatesan et al. | 438/622 |

\* cited by examiner

*Primary Examiner*—Caridad Everhart
*Assistant Examiner*—Chuong A Luu
(74) *Attorney, Agent, or Firm*—George O. Saile; Rosemary L.S. Pike

(57) ABSTRACT

A method for fabricating an increased capacitance metal-insulator-metal capacitor using an integrated copper dual damascene process is described. A first dual damascene opening and a pair of second dual damascene openings are provided in a first dielectric layer overlying a substrate. The first and second dual damascene openings are filled with a first copper layer wherein the filled first dual damascene opening forms a logic interconnect and the filled pair of second dual damascene openings forms a pair of capacitor electrodes. The first dielectric layer is etched away between the pair of capacitor electrodes leaving a space between the pair of capacitor electrodes. The space between the pair of capacitor electrodes is filled with a high dielectric constant material to complete fabrication of a vertical MIM capacitor in the fabrication of an integrated circuit device. The fabrication of the capacitor can begin at any metal layer. The process of the invention can be extended to form a parallel capacitor, a series capacitor, stacked capacitors, and so on.

34 Claims, 7 Drawing Sheets

US 6,624,040 B1

SELF-INTEGRATED VERTICAL MIM CAPACITOR IN THE DUAL DAMASCENE PROCESS

BACKGROUND OF THE INVENTION (1) Field of the Invention

The present invention relates to methods of fabricating a metal-insulator-metal capacitor, and more particularly, to methods of metal-insulator-metal capacitors integrated with copper damascene processes in the fabrication of an integrated circuit device.

(2) Description of the Prior Art

Capacitors are critical components in the integrated circuit devices of today. Metal-insulator-metal (MIM) capacitors have been used in the art. However, a number of problems exist. 1) When huge copper plates larger than about 8 to 10 microns are polished using chemical mechanical polishing (CMP), severe dishing occurs. Therefore, big MIM capacitor plates with dimensions greater than 10×10 microns are not possible. 2) Packing density is difficult to increase with passive devices present. A way to overcome this problem in the case of capacitors is to increase the capacitance per unit area. 3) More than one additional mask is required to process a MIM capacitor in the copper backend process. This increases process cost. It is desired to provide a method for forming a MIM capacitor which overcomes these problems.

A number of patents address MIM capacitors. U.S. Pat. No. 6,271,084 to Tu et al shows a MIM capacitor in a dual damascene opening, but copper is not used. U.S. Pat. No. 6,143,601 to Sun shows a tungsten MIM capacitor. U.S. Pat. No. 6,259,128 to Adler et al teaches a copper MIM capacitor that is patterned. U.S. Pat. No. 6,320,244 to Alers et al teaches forming a MIM capacitor in a dual damascene opening where the bottom electrode comprises a barrier metal, but the upper electrode is copper which is planarized using CMP. However, this capacitor takes up both vertical and horizontal space and has limited flexibility in design of the capacitor. U.S. Pat. No. 6,159,787 to Aitken et al show a metal trench capacitor. U.S. Pat. No. 6,025,226 to Gambino et al discloses a MIM capacitor within a trench. However, leakage current may be a problem in this device. U.S. Pat. No. 6,087,261 to Nishikawa et al, U.S. Pat. No. 6,157,793 to Lou, and U.S. Pat. No. 6,069,051 to Nguyen et al disclose MIM capacitors. U.S. Pat. No. 6,117,747 to Shao et al shows a MOM capacitor and a dual damascene process, but the capacitor is not formed completely within a damascene opening.

SUMMARY OF THE INVENTION

Accordingly, it is a primary object of the invention to provide an effective and very manufacturable process for producing a metal-insulator-metal capacitor.

Another object of the present invention is to provide a method for fabricating a metal-insulator-metal capacitor having increased capacitance.

Yet another object of the present invention is to provide a method for fabricating an increased capacitance metal-insulator-metal capacitor using an integrated copper dual damascene process.

A further object is to provide a method for fabricating an increased capacitance metal-insulator-metal capacitor using an integrated copper dual damascene process wherein erosion and dishing are avoided.

In accordance with the objects of this invention, a method for fabricating an increased capacitance metal-insulator-metal capacitor using an integrated copper dual damascene process is achieved. A first dual damascene opening and a pair of second dual damascene openings are provided in a first dielectric layer overlying a substrate. The first and second dual damascene openings are filled with a first copper layer wherein the filled first dual damascene opening forms a logic interconnect and the filled pair of second dual damascene openings forms a pair of capacitor electrodes. The first dielectric layer is etched away between the pair of capacitor electrodes leaving a space between the pair of capacitor electrodes. The space between the pair of capacitor electrodes is filled with a high dielectric constant material to complete fabrication of a vertical MIM capacitor in the fabrication of an integrated circuit device. The fabrication of the capacitor can begin at any metal layer. The process of the invention can be extended to form a parallel capacitor, a series capacitor, stacked capacitors, and so on.

BRIEF DESCRIPTION OF THE DRAWINGS

In the following drawings forming a material part of this description, there is shown.

DESCRIPTION OF THE PREFERRED EMBODIMENTS

The process of the present invention provides a method for fabricating an increased capacitance metal-insulator-metal (MIM) capacitor using a self-integrated copper dual damascene process. Process difficulties such as copper surface unevenness, hillocks, dishing and erosion can be avoided by the process of the invention. The MIM process of the invention can be integrated into the copper dual damascene process regardless of the dual damascene approach. For example, 1) buried etch stop approach, 2) clustered approach, 3) Partial via first approach, 4) Full via first approach, 5) line first approach, and so on may be used.

Figure 1:
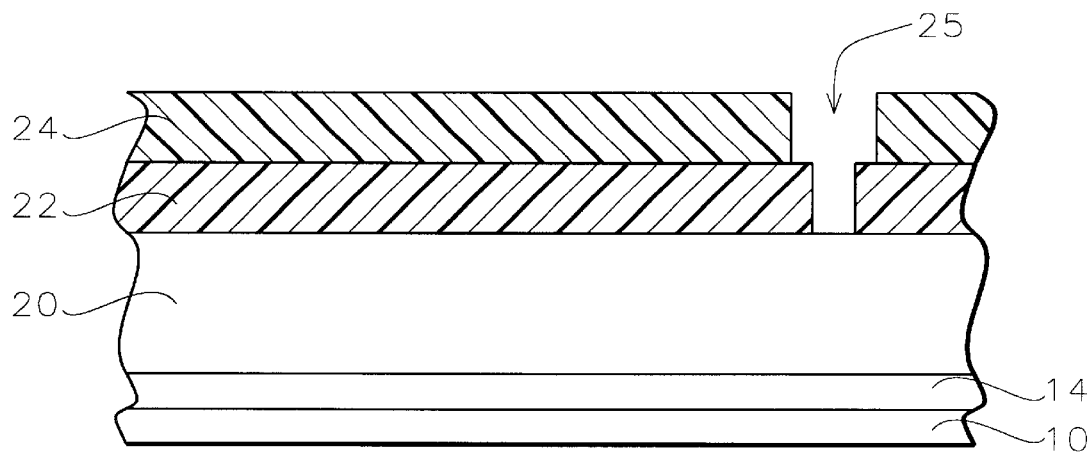
FIGS. 1 through 6 and 8 through 12 are schematic cross-sectional representations of a preferred embodiment of the present invention.

Referring now more particularly to FIG. 1, there is shown a partially completed integrated circuit device. Semiconductor device structures are formed in and on the semiconductor substrate 10. For example, gate electrodes and associated source and drain regions, not shown, may be fabricated. The semiconductor device structures and an insulating layer formed thereover are represented by 14 in FIG. 1.

An intermetal dielectric (IMD) layer 20 is deposited over layer 14. The dielectric layer 20 may be silicon dioxide, tetraethoxysilane (TEOS) oxide, CORAL, Black Diamond, and other low dielectric constant (k) materials, having a thickness of between about a few hundred and a few thousand Angstroms. This layer should be a low dielectric constant material having a dielectric constant of less than about 4. A masking layer 22/24 is formed over the dielectric layer 20 having a pattern 25 for a dual damascene opening.

Figure 2:
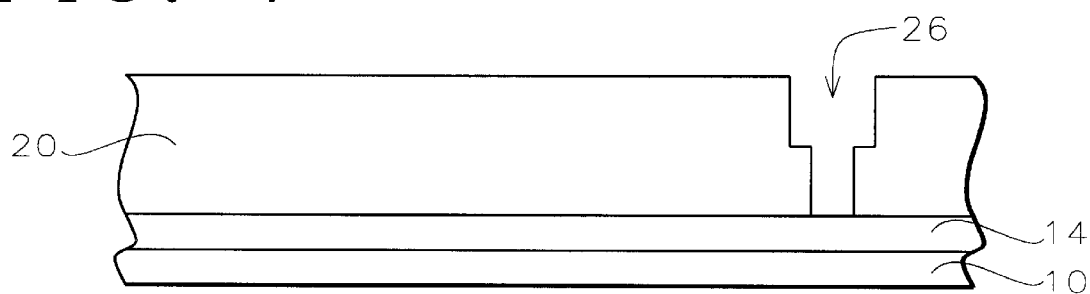

Referring now to FIG. 2, the dual damascene opening 26 is transferred into the dielectric layer 20 where the opening 26 overlies and contacts an underlying device, not shown, within layer 14. The method of transferring the dual damascene pattern into the dielectric layer may be any of the conventional approaches such as via first, line first, with or without an etch stop, and so on.

Figure 3:
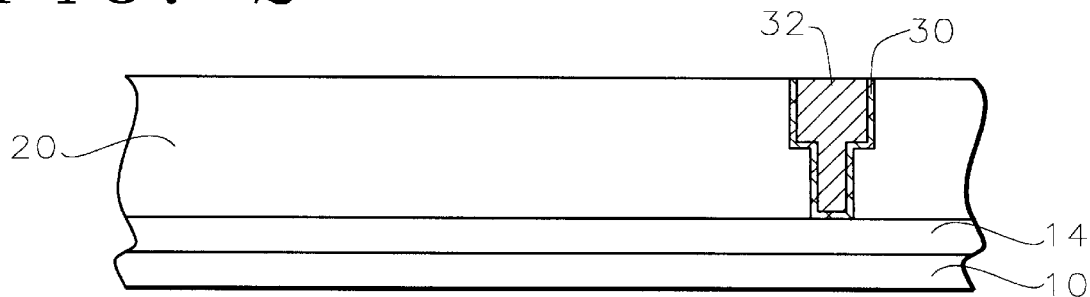

Now, a barrier metal layer 30 is deposited conformally within the opening 26, as illustrated in FIG. 3. The barrier metal layer may comprise tantalum or tantalum nitride, for example, and have a thickness of between about 50 and 500 Angstroms. The dual damascene opening is filled with copper, such as by electroplating or electroless plating. The copper and the barrier metal layer are planarized such as by CMP to leave these layers only within the dual damascene opening, as shown in FIG. 3.

The copper damascene 32 shown in FIG. 3 is a typical interconnect. Such interconnects can be formed prior to and after the formation of the capacitor of the invention. It is important to note that the MIM capacitor of the present invention can be formed in any of the metal layers. Thus, while the capacitor could be formed here in this first described copper damascene, for illustration purposes, the capacitor will be constructed in the next metal layer.

Figure 4:
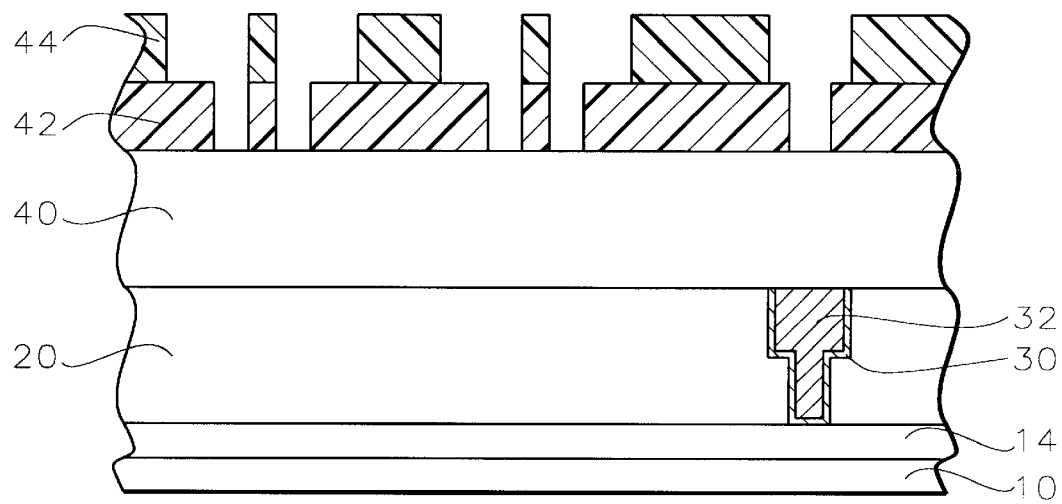

Now, the vertical capacitor process of the present invention will be described. Referring now to FIG. 4, a second dielectric layer 40 is deposited over the bottom electrode 32. The dielectric layer 40 may be of a similar material to the first dielectric layer, preferably having a low dielectric constant and having a thickness of between about a few hundred and a few thousand Angstroms. A second masking layer 42/44 is formed over the dielectric layer 40 having patterns for second dual damascene openings as shown.

Figure 5:
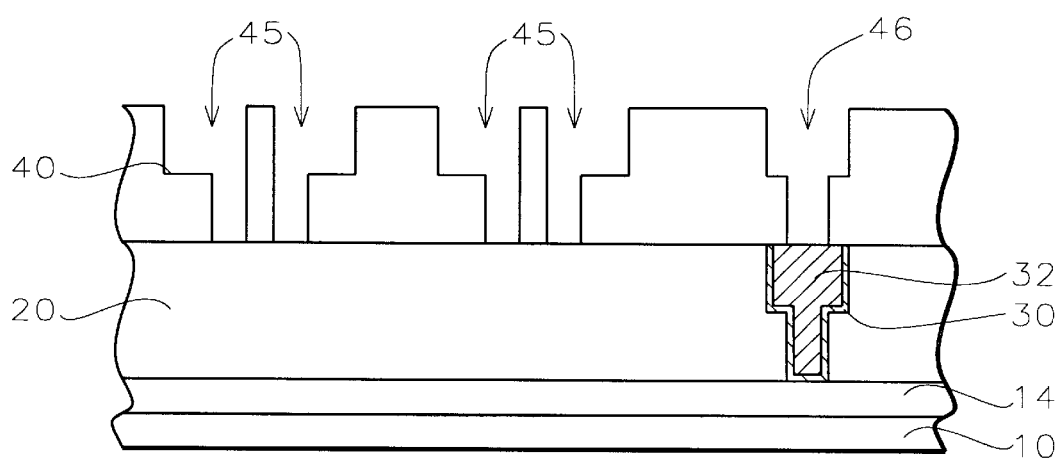

The patterns are transferred from the mask 42/44 into the dielectric layer 44 as illustrated in FIG. 5. Again, the patterns may be transferred into the dielectric layer using any of the dual damascene processes. Dual damascene openings 45 will be the electrodes of vertical capacitors of the present invention. Dual damascene opening 46 is a standard core logic interconnect, formed concomitantly with the vertical capacitors of the present invention.

Figure 6:
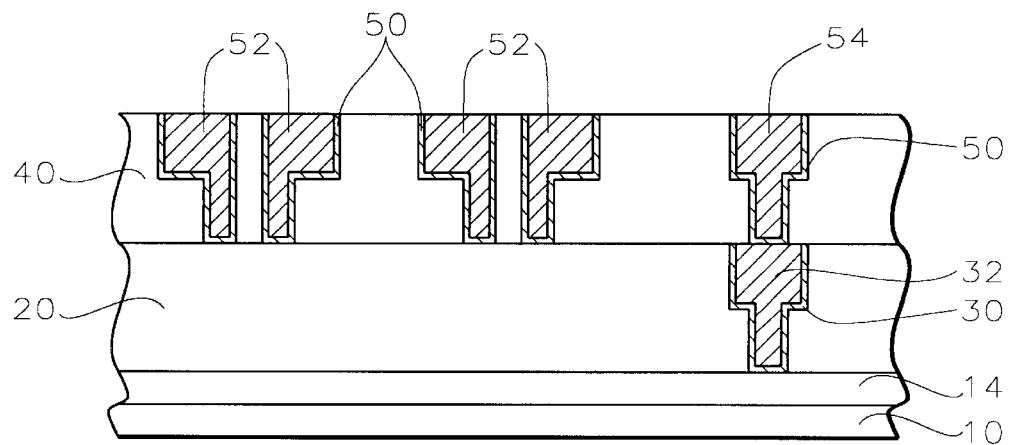

Now, a barrier metal layer 50 is deposited conformally within the openings 45 and 46, as illustrated in FIG. 5. The barrier metal layer may comprise tantalum or tantalum nitride, for example, and have a thickness of between about 50 and 500 Angstroms. With the continuous advancement of technology, it is conceivable that one day a barrier metal layer may no longer be required. The dual damascene openings are filled with copper, such as by electroplating or electroless plating. The copper and the barrier metal layer are planarized such as by CMP to leave these layers only within the dual damascene openings, as shown in FIG. 6. The copper layer 52 forms the vertical capacitor electrodes of the present invention. Copper layer 54 forms the standard core logic copper interconnect.

Figures 7A, 7B:
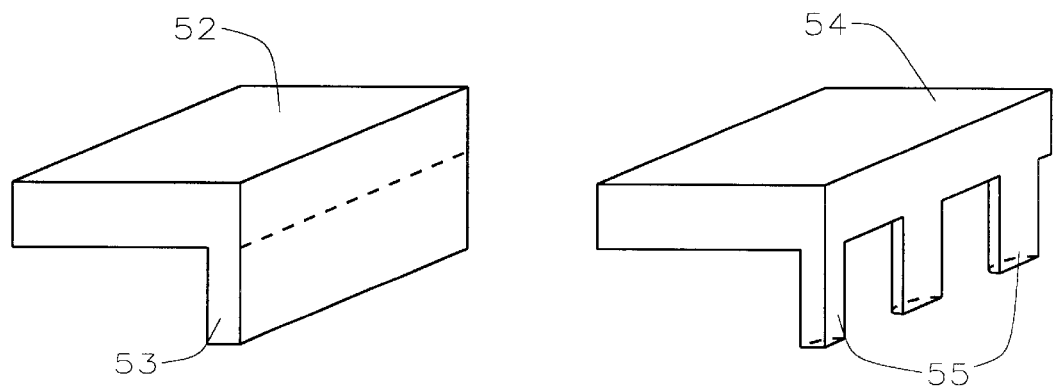
FIG. 7A is an isometric view of capacitor electrode 52 of FIG. 6.
FIG. 7B is an isometric view of logic interconnect 54 of FIG. 6.

FIG. 7A illustrates an isometric view of one of the capacitor electrodes 52. Lower portion 52 forms a trench as shown in the figure. In contrast, in the portion of the logic copper interconnect 54 shown in FIG. 7B, the lower portion is in the form of vias 55 rather than a continuous trench.

Figure 8:
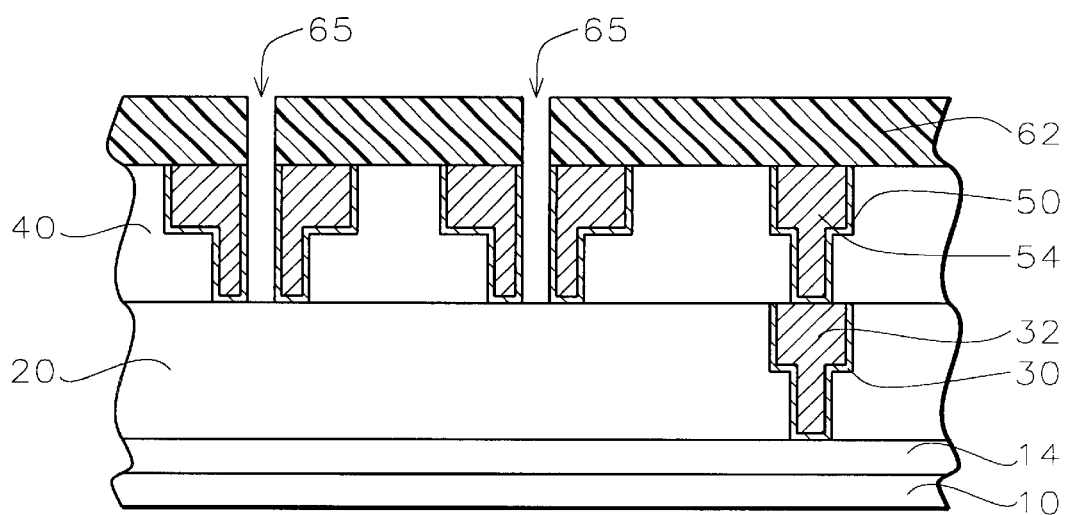
Figure 9:
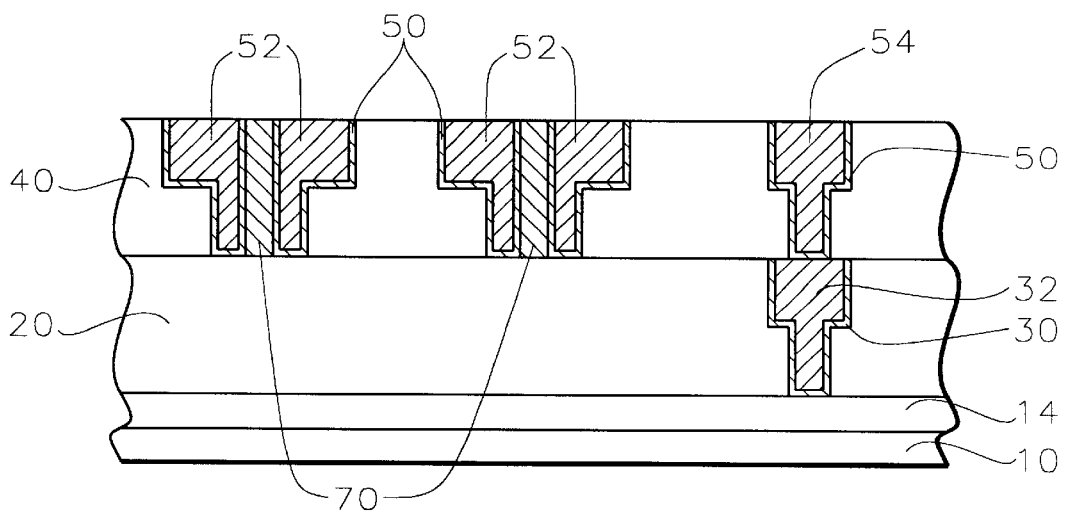

A third masking layer 62 is formed over the capacitor electrodes 52 and the copper interconnect 54 having patterns for openings between each two of the capacitor electrodes 52 as shown in FIG. 8. Vias 65 are etched through the dielectric layer 40 within the pattern openings. The etching step uses a process having high selectivity between the dielectric material of layer 40 and the metal 50/52. Plasma etch processes are preferable, but wet etches may be feasible.

Referring now to FIG. 8, a high dielectric constant (k) material layer 70 is deposited within the via openings 65. The high k material layer may comprise silicon nitride, tantalum oxide, hafnium oxide, zirconium oxide, or aluminum oxide for example. The dielectric constant should be greater than about 7. This layer 70 forms the capacitor dielectric between the two capacitor electrodes 52.

Figure 10:
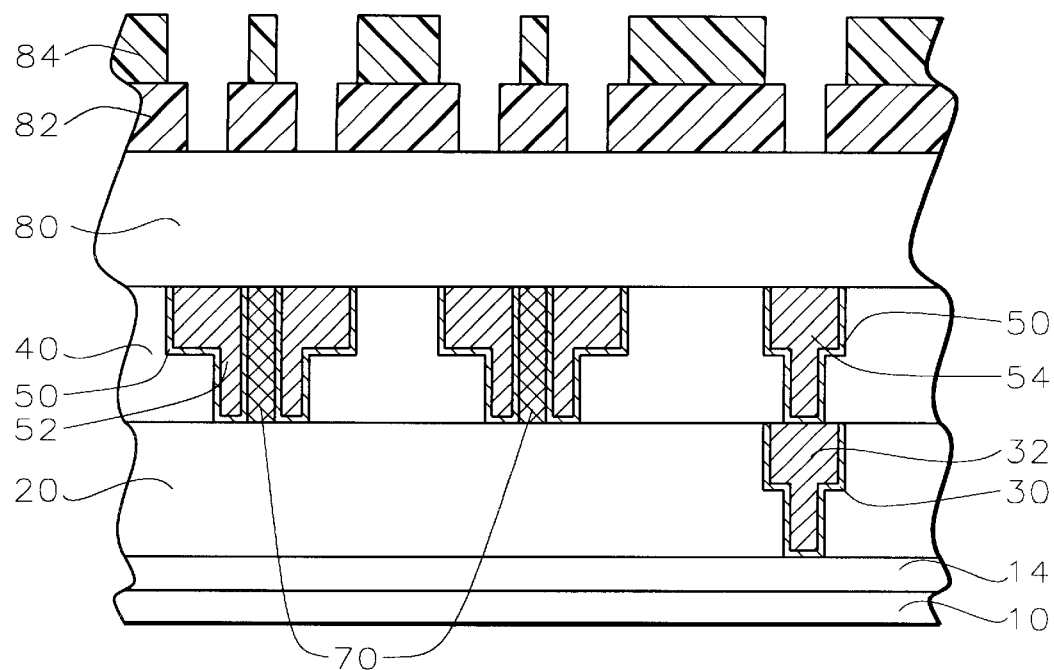

Referring now to FIG. 10, a third dielectric layer 80 is deposited over the vertical capacitors 52/70/52 and the copper interconnect 54. The dielectric layer 80 may be of a similar material to the first and second dielectric material and have a similar thickness. A fourth masking layer 82/84 is formed over the dielectric layer 80 having patterns for third dual damascene openings as shown.

Figure 11:
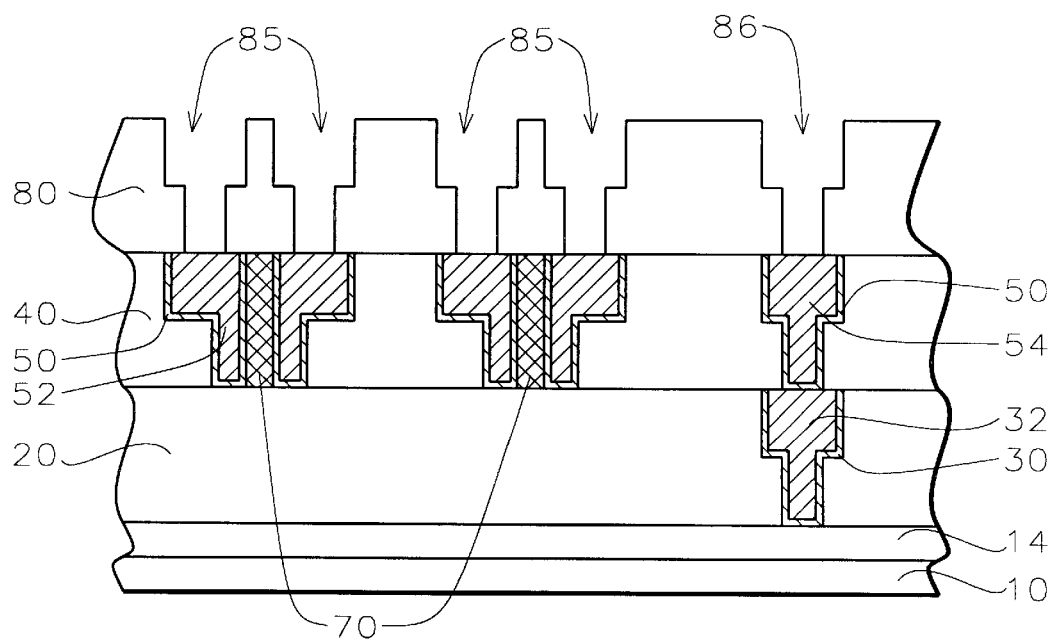

The patterns are transferred from the mask 82/84 into the dielectric layer 80 as illustrated in FIG. 11. As in other steps, the patterns may be transferred into the dielectric layer using any of the dual damascene processes. Dual damascene openings 85 and 86 are standard logic interconnects. Dual damascene openings 85 contact the vertical capacitor electrodes 52. Dual damascene opening 86 contacts the standard copper interconnect 54.

Figure 12:
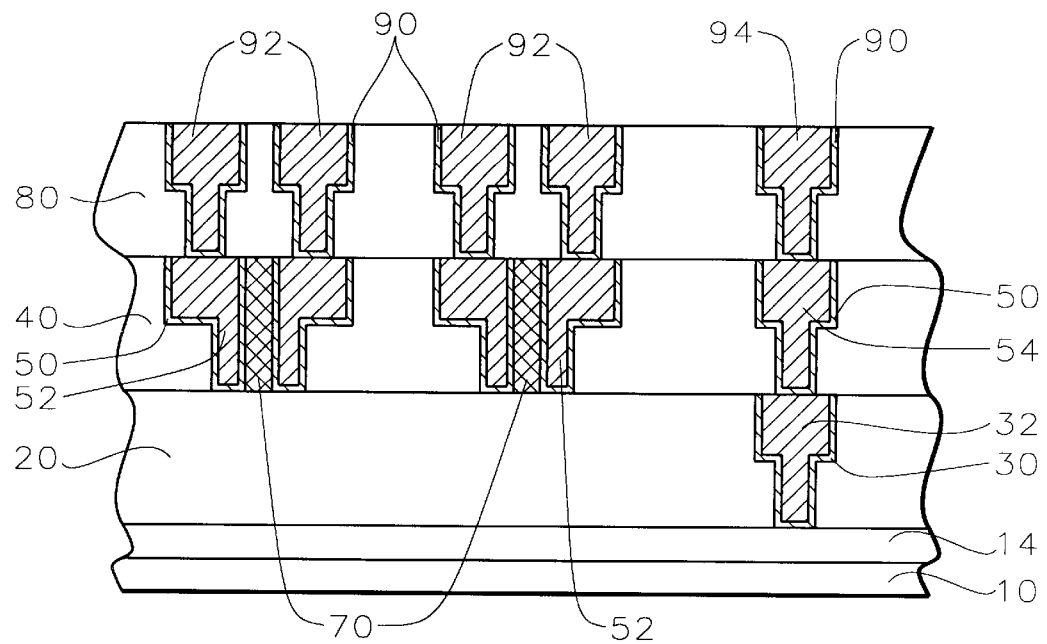

Now, a barrier metal layer 90 is deposited conformally within the openings 85 and 86, as illustrated in FIG. 12. The barrier metal layer may comprise tantalum or tantalum nitride, for example, and have a thickness of between about 50 and 500 Angstroms. The dual damascene openings are filled with copper, such as by electroplating or electroless plating. The copper and the barrier metal layer are planarized such as by CMP to leave these layers only within the dual damascene openings, as shown in FIG. 12. The copper layer 92, 94 forms interconnects to the capacitors and lower level logic interconnects.

This completes formation of the MIM capacitor of the present invention. The packing density of devices can be increased because of the increased capacitance per unit area in the MIM capacitors since the device orientation is vertical instead of horizontal.

Figure 13:
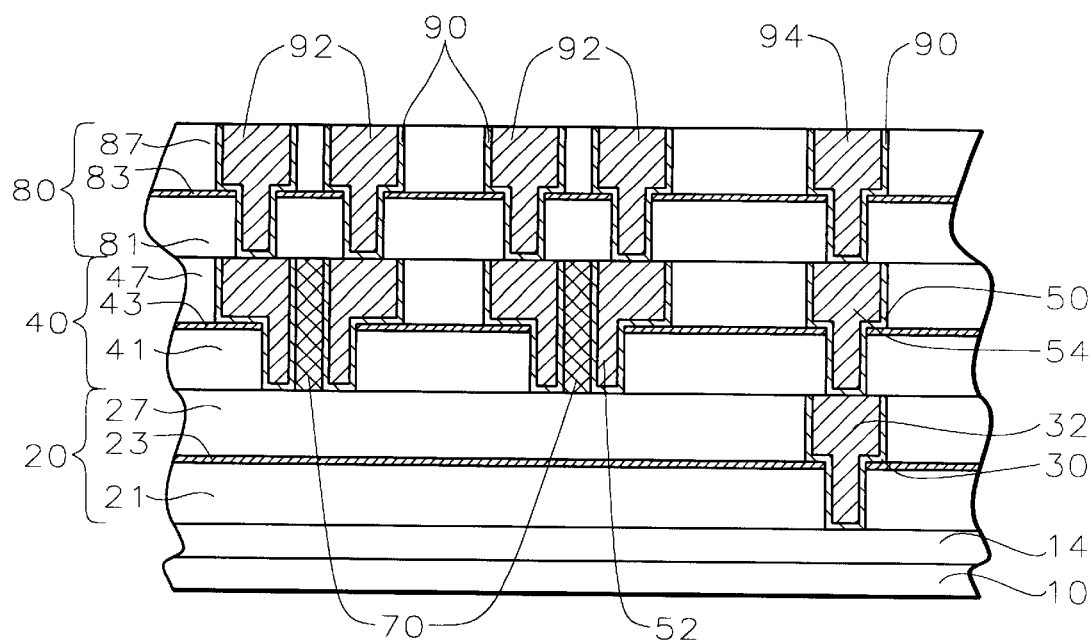
FIG. 13 is a schematic cross-sectional representation of a preferred embodiment of the present invention where a buried etch stop dual damascene process is used.

FIG. 13 illustrates the completed MIM capacitor of the present invention where a buried etch stop approach is used to form the dual damascene openings. Dielectric layer 20 comprises dielectric layers 21 and 27 and an intervening buried etch stop layer 23. Dielectric layers 40 and 80 include buried etch stop layers 43 and 83, respectively. Vertical capacitor electrodes 52 are shown with the intervening capacitor dielectric layer 70.

Figure 14:
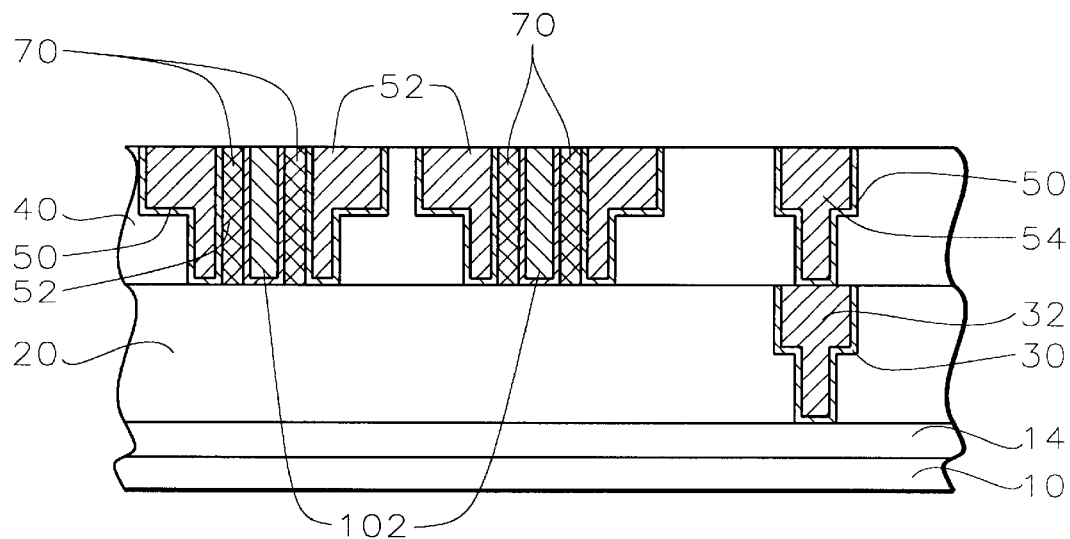
FIG. 14 is a schematic cross-sectional representation of a second preferred embodiment of the present invention.
Figure 15:
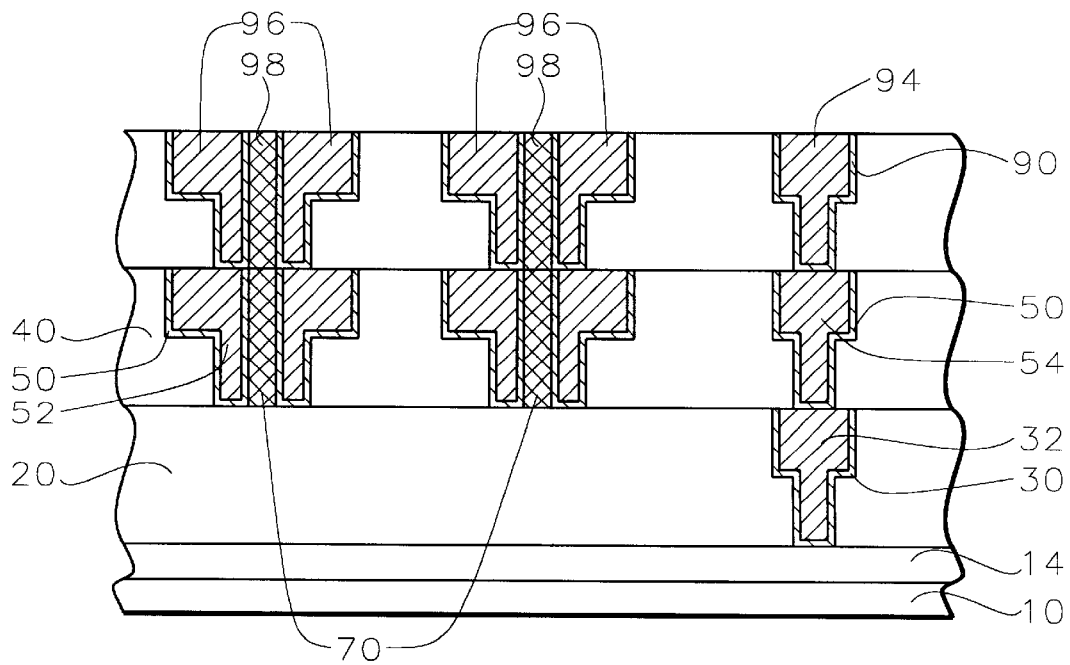
FIG. 15 is a schematic cross-sectional representation of a third preferred embodiment of the present invention.

The process of the present invention allows great flexibility in capacitor structure design and circuitry without requiring additional wiring interconnects. For example, FIG. 14 illustrates a parallel vertical capacitor 52/70/102/70/52 with capacitor dielectric 70 where 102 is a shared electrode. A series vertical capacitor, not shown, is also easily achieved. FIG. 15 illustrates stacking of capacitors to further maximize space usage. Vertical capacitor 96/98/96, where 98 is the capacitor dielectric, overlies vertical capacitor 52/70/52.

The process of the present invention provides a method for forming vertical MIM capacitors using an integrated copper damascene process. The vertical capacitors of the present invention can be fabricated beginning at any metal level. Since the capacitors are formed together with the logic interconnect process, only one additional mask is required for removing the low-k material between the capacitor electrodes and replacing it with a high-k capacitor dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a MIM capacitor comprising:
   providing a first dual damascene opening and a pair of second dual damascene openings in a first dielectric layer overlying a substrate;
   filling said first and second dual damascene openings with a first copper layer wherein filled said first dual damascene opening forms a logic interconnect and wherein filled said pair of second dual damascene openings forms a pair of capacitor electrodes;
   etching away said first dielectric layer between said pair of capacitor electrodes leaving a space between said pair of capacitor electrodes; and
   filling said space between said pair of capacitor electrodes with a high dielectric constant material to complete fabrication of said MIM capacitor in the fabrication of said integrated circuit device.

2. The method according to claim 1 wherein said steps of providing and forming said first and second dual damascene openings are selected from the processes consisting of: partial via first, full via first, line first, and embedded via.

3. The method according to claim 1 further comprising depositing a barrier metal layer under said copper layer within said first and second dual damascene openings.

4. The method according to claim 3 wherein said barrier metal layer is selected from the group consisting of tantalum and tantalum nitride.

5. The method according to claim 1 wherein said step of filling said first and second dual damascene openings with a copper layer comprises:
   depositing a barrier metal layer within said first and second dual damascene openings;
   depositing a copper layer overlying said barrier metal layer and filling said first and second dual damascene openings, and
   planarizing said copper layer and said barrier metal layer to leave said copper layer and said barrier metal layer only within said first and second dual damascene openings.

6. The method according to claim 5 wherein said step of planarizing comprises chemical mechanical polishing.

7. The method according to claim 1 wherein said first dielectric layer comprises a low dielectric constant material having a dielectric constant less than about 4.

8. The method according to claim 1 wherein said step of etching away said first dielectric layer between said pair of capacitor electrodes is selected from the group consisting of: plasma etching and wet etching.

9. The method according to claim 1 wherein said high dielectric constant material has a dielectric constant greater than about 7.

10. The method according to claim 1 wherein said substrate contains semiconductor device structures covered with an insulating layer.

11. The method according to claim 1 wherein said substrate contains semiconductor device structures and any number of levels of overlying metal interconnections.

12. The method according to claim 1 wherein said first and second dual damascene openings are formed at any level of metal interconnections.

13. The method according to claim 1 further comprising:
    depositing a second dielectric layer overlying said logic interconnect and said pair of capacitor electrodes;
    forming a third dual damascene openings through said second dielectric layer to said logic interconnect and forming a pair of fourth dual damascene openings through said second dielectric layer wherein each of said pair of fourth dual damascene openings contacts one of said pair of capacitor electrodes; and
    filling said third and fourth dual damascene openings with a second copper layer wherein filled said third dual damascene opening forms a second logic interconnect and wherein filled said pair of fourth dual damascene openings forms a second pair of capacitor electrodes;
    etching away said second dielectric layer between said second pair of capacitor electrodes leaving a space between said second pair of capacitor electrodes; and
    filling said space between said second pair of capacitor electrodes with a high dielectric constant material to complete fabrication of a stacked MIM capacitor.

14. The method according to claim 1 further comprising forming additional pairs of second dual damascene openings to form multiple, parallel, or series capacitors wherein said high dielectric constant material is deposited between each said pair of filled said second dual damascene openings.

15. A method for fabricating a MIM capacitor comprising:
    providing a first dual damascene opening and a pair of second dual damascene openings in a first dielectric layer overlying a substrate;
    depositing a copper layer overlying said barrier metal layer and filling said first and second dual damascene openings;
    planarizing said copper layer to leave said copper layer only within said first and second dual damascene openings wherein filled said first dual damascene opening forms a logic interconnect and wherein filled said pair of second dual damascene openings forms a pair of capacitor electrodes;
    etching away said first dielectric layer between said pair of capacitor electrodes leaving a space between said pair of capacitor electrodes; and
    filling said space between said pair of capacitor electrodes with a high dielectric constant material to complete fabrication of said MIM capacitor in the fabrication of said integrated circuit device.

16. The method according to claim 15 wherein said steps of providing and forming said first and second dual damascene openings are selected from the processes consisting of: partial via first, full via first, line first, and embedded via.

17. The method according to claim 15 further comprising depositing a barrier metal layer underlying said copper layer within said first and second dual damascene openings.

18. The method according to claim 17 wherein said barrier metal layer is selected from the group consisting of tantalum and tantalum nitride.

19. The method according to claim 15 wherein said step of planarizing comprises chemical mechanical polishing.

20. The method according to claim 15 wherein said first dielectric layer comprises a low dielectric constant material having a dielectric constant less than about 4.

21. The method according to claim 15 wherein said step of etching away said first dielectric layer between said pair of capacitor electrodes is selected from the group consisting of: plasma etching and wet etching.

22. The method according to claim 15 wherein said high dielectric constant material has a dielectric constant greater than about 7.

23. The method according to claim 15 wherein said substrate contains semiconductor device structures and any number of levels of overlying metal interconnections.

24. The method according to claim 15 wherein said first and second dual damascene openings are formed at any level of metal interconnections.

25. The method according to claim 15 further comprising:

depositing a second dielectric layer overlying said logic interconnect and said pair of capacitor electrodes;

forming a third dual damascene openings through said second dielectric layer to said logic interconnect and forming a pair of fourth dual damascene openings through said second dielectric layer wherein each of said pair of fourth dual damascene openings contacts one of said pair of capacitor electrodes; and filling said third and fourth dual damascene openings with a second copper layer wherein filled said third dual damascene opening forms a second logic interconnect and wherein filled said pair of fourth dual damascene openings forms a second pair of capacitor electrodes;

etching away said second dielectric layer between said second pair of capacitor electrodes leaving a space between said second pair of capacitor electrodes; and filling said space between said second pair of capacitor electrodes with a high dielectric constant material to complete fabrication of a stacked MIM capacitor.

26. The method according to claim 15 further comprising forming additional pairs of second dual damascene openings to form multiple, parallel, or series capacitors wherein said high dielectric constant material is deposited between each said pair of filled said second dual damascene openings.

27. A method for fabricating a MIM capacitor comprising:

providing a first dual damascene opening in a first dielectric layer overlying a substrate;

filling said first dual damascene opening with a first copper layer to form a first logic interconnect;

depositing a second dielectric layer overlying said first dielectric layer and said first logic interconnect;

forming a second dual damascene opening through said second dielectric layer to contact said first logic interconnect and forming a pair of third dual damascene openings through said second dielectric layer to said first dielectric layer;

filling said second dual damascene opening and said pair of third dual damascene openings with a second copper layer wherein filled said second dual damascene opening forms a second logic interconnect and wherein filled said pair of third dual damascene openings forms a pair of capacitor electrodes;

etching away said second dielectric layer between said pair of capacitor electrodes leaving a space between said pair of capacitor electrodes; and filling said space between said pair of capacitor electrodes with a high dielectric constant material to complete fabrication of said MIM capacitor in the fabrication of said integrated circuit device.

28. The method according to claim 27 wherein said steps of providing and forming said first, second, and third dual damascene openings are selected from the processes consisting of: partial via first, full via first, line first, and embedded via.

29. The method according to claim 27 further comprising:

depositing a first barrier metal layer underlying said first copper layer within said first dual damascene opening; and depositing a second barrier metal layer underlying said second copper layer within said second and third dual damascene openings.

30. The method according to claim 27 wherein said first and second dielectric layers comprises a low dielectric constant material having a dielectric constant less than about 4.

31. The method according to claim 27 wherein said high dielectric constant material has a dielectric constant greater than about 7.

32. The method according to claim 27 wherein said second and third dual damascene openings are formed at any level of metal interconnections.

33. The method according to claim 27 further comprising forming additional pairs of third dual damascene openings to form multiple, parallel, or series capacitors wherein said high dielectric constant material is deposited between each said pair of filled said second dual damascene openings.

34. The method according to claim 27 further comprising forming additional capacitors in subsequent layers of dielectric material to form stacked vertical capacitors.

* * * * *